United States Patent [19]
Hung et al.

[11] Patent Number: 5,280,203
[45] Date of Patent: Jan. 18, 1994

[54] LOOK-AHEAD ASYNCHRONOUS REGISTER SET/RESET IN PROGRAMMABLE LOGIC DEVICE

[75] Inventors: Chuan-Yung Hung, Cupertino; Ray-Lin Wan, Milpitas, both of Calif.

[73] Assignee: Altera Corporation, San Jose, Calif.

[21] Appl. No.: 883,100

[22] Filed: May 15, 1992

[51] Int. Cl.⁵ .......................................... H03K 19/173
[52] U.S. Cl. ...................................... 307/465; 307/443; 307/272.2; 307/480
[58] Field of Search ..................... 307/465, 443, 272.2, 307/468, 480; 365/189.05

[56] References Cited

U.S. PATENT DOCUMENTS

| | | | |
|---|---|---|---|
| 4,777,623 | 10/1988 | Shimazu et al. | 365/189.05 |
| 4,849,653 | 7/1989 | Imai et al. | 307/279 |
| 4,974,241 | 11/1990 | McClure et al. | 307/279 |
| 5,087,835 | 2/1992 | Hattangadi | 307/443 |

*Primary Examiner*—Edward P. Westin
*Assistant Examiner*—Jon Santamauro
*Attorney, Agent, or Firm*—Townsend and Townsend Khourie and Crew

[57] ABSTRACT

A programmable logic device in which macrocell register reset time, $T_{clear}$, and set time, $T_{set}$, are comparable in speed to the combinatorial propagation delay time, $T_{pd}$. In setting or resetting the macrocell register, the Set (Reset) signal is applied simultaneously to a clocked master latch in the macrocell register and to an output node. During the Set (Reset) period the slave latch of the macrocell register is disconnected from the output node.

10 Claims, 2 Drawing Sheets

LOOK-AHEAD ASYNCHRONOUS REGISTER SET/RESET IN PROGRAMMABLE LOGIC DEVICE

BACKGROUND OF THE INVENTION

This invention relates generally to integrated circuits (IC) such as programmable logic devices (PLD), and more particularly the invention relates to a look-ahead macrocell register set/reset circuit having improved response time.

The programmable logic device, or PLD, is an integrated circuit which can be configured by the end user at his location to perform a specific unique logic function. Typically, the PLD comprises an array of programmable logic elements such as AND gates which combines the logistical advantages of standard fixed integrated circuits with the architectural flexibility of custom devices.

The combinatorial outputs of a PLD array can be connected through registers to an output driver and pad for registered configuration or directly to the output driver for combinatorial configuration to increase speed. Heretofore, much effort has been directed to optimizing the combinatorial propagation speed or propagation delay time, $T_{pd}$, by providing the direct connection of the combinatorial logic to the output. However, the reset/set for the output is transmitted through the macrocell register without consideration for the reset/set times, $T_{clear}$ or $T_{set}$, for the macrocell register. Thus, $T_{clear}$ is normally slower than $T_{pd}$ by at least 1 nanosecond and sometimes as much as 3 nanoseconds.

SUMMARY OF THE INVENTION

The present invention is directed to reset/set circuitry which reduces the output register reset/set time, $T_{clear}$ or $T_{set}$, to the propagation delay time, $T_{pd}$. Further, $T_{clear}$ can be independent of the state of the clock in the PLD.

In a programmable logic device having a macrocell register including master and slave latches for sampling and clocking data to an output node, reset circuitry is provided for resetting the macrocell register and the macrocell node including first means responsive to a reset signal for applying a logic "0" to an input to the master latch and second means responsive to the reset signal for simultaneously applying a logic "0" to the output node. In preferred embodiments the first means and the second means each comprises a field effect transistor connected between a logic "0" voltage potential and the master latch or output node with a gate for receiving the reset signal.

Similarly, set circuitry can be provided including third means responsive to a set signal for applying a logic "0" to an output of the master latch and fourth means responsive to a set signal for simultaneously applying a logic "1" voltage potential to the output node. Again, in preferred embodiments the third means and the fourth means each comprises a field effect transistor connected between a voltage potential and the master latch for applying a logic "0" to the latch output, an a field effect transistor connected to a logic "1" voltage potential and having a gate responsive to the inversion of the set signal for applying a logic "1" to the output node.

By providing set/reset circuitry for simultaneously setting and resetting the output node of a circuit array while the macrocell register is being set/reset, the clear and set times for the array become equivalent to the propagation delay time, $T_{pd}$.

The invention and objects and features thereof will be more readily apparent from the following detailed description and appended claims when taken with the drawings.

DETAILED DESCRIPTION OF THE ILLUSTRATIVE EMBODIMENTS

Figure 1:
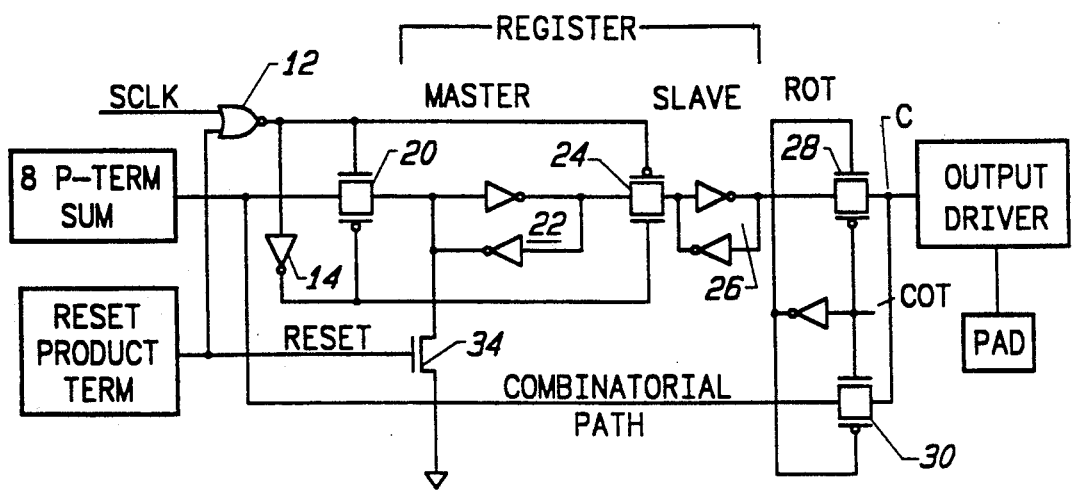
FIG. 1 is a schematic of a macrocell register and output driver illustrating the combinatorial path and reset circuitry in accordance with the prior art.

Referring now to the drawing, FIG. 1 is a schematic of conventional macrocell circuitry in a PLD design wherein an 8 Product Term Sum is applied through a macrocell register to an output node C and then to an output driver and pad. The register is clocked by a system clock (SCLK) which alternately drives the transmission gate 20 which connects the product sum term to a master latch 22 and the transmission gate 24 which connects the master latch 22 to a slave latch 26. Transmission gates 20 and 24 are clocked by the system clock, SCLK, which is transmitted through NOR gate 12 and invertor 14 to the control electrodes of the CMOS transmission gates. The slave latch 26 is connected to an output node C through transmission gate 28.

To increase the combinatorial propagation speed, $T_{pd}$, the 8 Product Term Sum is connected directly to the output node C through a transmission gate 30 in response to a combinatorial output transmission signal COT. Thus the master/slave latch can be blocked out and the sum term connected directly to the output node C.

To reset the output node C, a reset product term signal is applied as one input to the NOR gate 12, and the input to the master latch 22 is pulled to "0" through N channel transistor 34. The "0" input to the master latch is then clocked through the slave latch 26 in response to the clock signal applied to NOR gate 12 which delays application of the reset or "0" value through transmission gates 24 and 28 to the output node C. If the clock signal input to NOR gate 12 is "0" upon application of the reset product term input "1", additional delay is introduced in turning on the transmission gate 24. Thus, $T_{clear}$ is slower than $T_{pd}$ by at least 1 nanosecond-3 nanoseconds.

Figure 2:
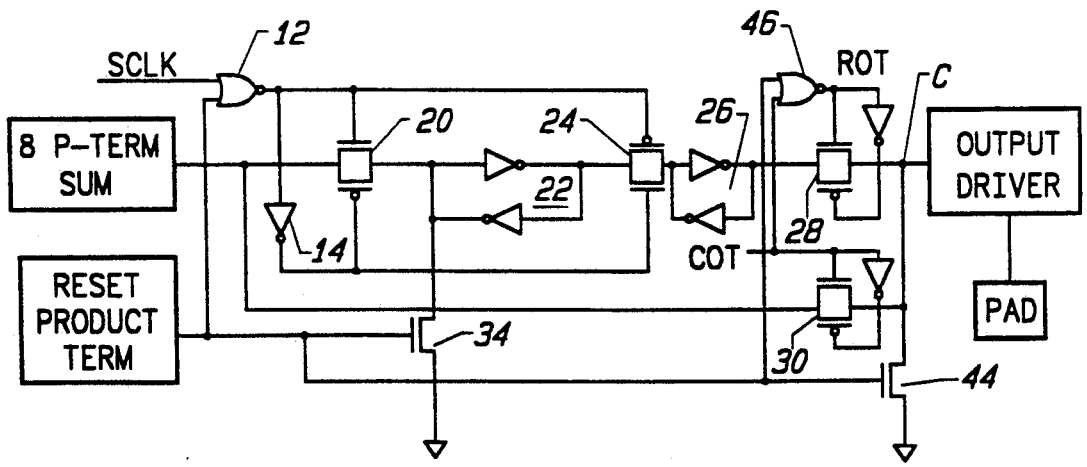
FIG. 2 is a schematic of a macrocell register and output driver including reset circuitry in accordance with one embodiment of the invention.

FIG. 2 is a schematic of the macrocell register in accordance with one embodiment of the invention in which the Reset Product Term can operate faster in resetting the output node C by simultaneously applying the reset to the master latch and to the output node C. Like elements in the circuits of FIGS. 1 and 2 have the same reference numerals. In this embodiment the reset term is again applied to the gate of N channel transistor 34 to force the input of master latch 22 to "0". Simultaneously, the reset signal is applied to the gate of transistor 44 which ties the output node C to circuit ground for the simultaneous reset of the output node to the "0" value. The reset signal is applied as one input to NOR gate 46 which produces a "0" at ROT (ROT="1" for registered configuration output selection) to turn off the transmission gate 28 and disengaging the output node to C from the slave latch 26. The combinatorial configuration output selection signal, COT, is "0" for registered configuration.

Figure 3:
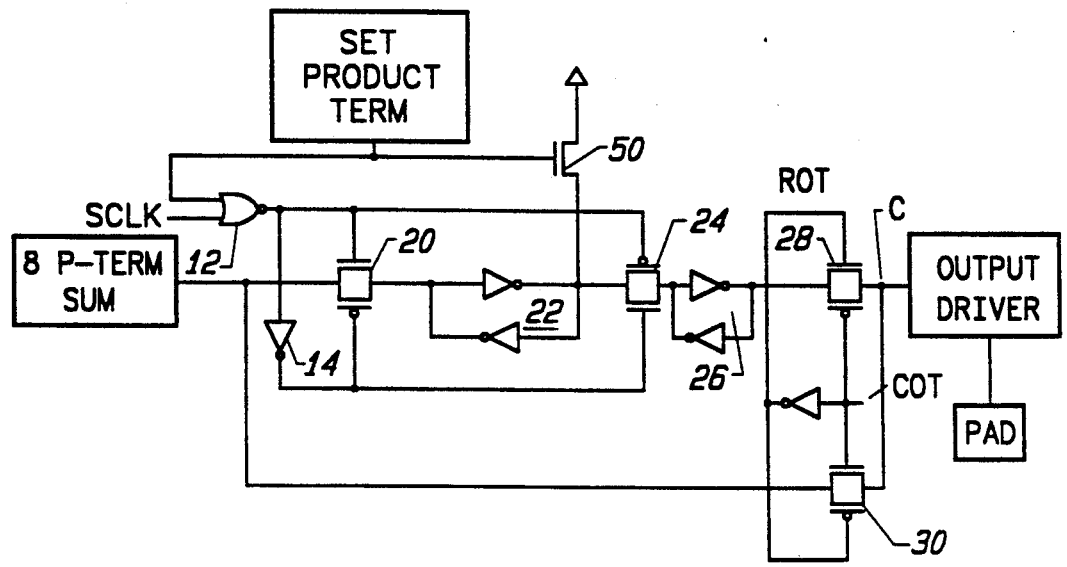
FIG. 3 is a schematic of a macrocell register and output driver illustrating the combinatorial path and set circuitry in accordance with the prior art.

FIG. 3 is a schematic of macrocell register circuitry including a set product term capability in accordance with the prior art. Again, the circuit is similar to the circuit of FIGS. 1 and 2, and like elements have the reference numerals. In this circuit the register is set in response to the Set Product Term by connecting the output of the master latch 22 to a "0" potential level through transistor 50 and hence "1" at the input of the master latch 22. Additional delay in applying the set signal to the output node C occurs through the master and slave latch stages, which must be clocked in response to the SCLK input signal and the Set Product Term which are applied to the NOR gate 12.

Figure 4:
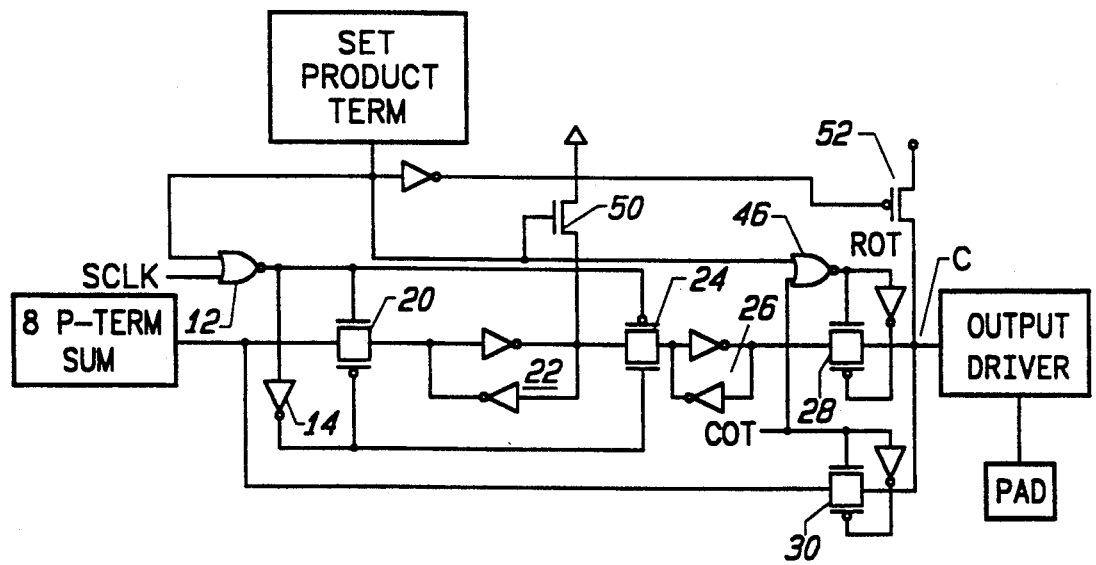
FIG. 4 is a schematic of a macrocell register and output driver including set circuitry in accordance with one embodiment of the invention.

FIG. 4 is a schematic of another embodiment of the invention in which the Set Product Term is simultaneously applied to the output of master latch 22 and to the output node C through P channel transistor 52. The Set Product Term is connected as one input to the NOR gate 46 which disconnects transmission gate 28 and the slave latch 26 from the output node C. Again, by simultaneously applying the Set Product Term to the master latch and to the output node C, $T_{set}$ becomes as fast as $T_{pd}$ in the output circuitry.

The look-ahead asynchronous register set/reset circuitry in accordance with the invention overcomes the delay in setting and clearing the macrocell register and output node of a macrocell such as a programmable logic device and enhances the overall operating characteristics of the macrocell.

While the invention has been described with reference to specific embodiments, the description is illustrative of the invention and is not to be construed as limiting the invention. For example, the Reset circuit of FIG. 2 and the Set circuit of FIG. 4 can be combined in one circuit. Thus, various modifications and applications may occur to those skilled in the art without departing from the true spirit and scope of the invention as defined by the appended claims.

What is claimed is:

1. In a programmable logic device having a macrocell register including master and slave latches for connecting a combinatorial output to an output node, reset circuitry for asynchronously resetting said macrocell register and said output node comprising:
   first means responsive to a reset signal for applying a logic "0" voltage potential to an input to said master latch, and
   second means responsive to said reset signal for simultaneously applying a logic "0" voltage potential directly to said output node, thereby providing look-ahead resetting of said output node while said master and slave latches are resetting.

2. The reset circuitry as defined by claim 1 wherein said first means includes a field effect transistor connected between a logic "0" voltage potential and said master latch and having a gate for receiving said reset signal.

3. The reset circuitry as defined by claim 2 wherein said second means includes a field effect transistor connected between a logic "0" voltage potential and said output node and having a gate for receiving said reset signal.

4. Circuitry as defined by claim 3 and further including set circuitry for asynchronously setting said macrocell and said output node comprising
   third means responsive to a set signal for applying a logic "0" voltage potential to an output of said master latch, and
   fourth means responsive to said set signal for simultaneously applying a logic "1" voltage potential directly to said output node, thereby providing look-ahead setting of said output node while said master and slave latches are setting.

5. Circuitry as defined by claim 4 wherein said third means comprises a field effect transistor connected between a logic "0" voltage potential and said master latch and having a gate for receiving said set signal.

6. Circuitry as defined by claim 5 wherein said fourth means comprises a field effect transistor connected between a logic "1" voltage potential and said output node and having a gate responsive to said set signal for applying a logic "1" voltage potential to said output node.

7. Circuitry as defined by claim 1 and further including set circuitry for asynchronously setting said macrocell and said output node comprising:
   third means responsive to a set signal for applying a logic "0" voltage potential to an output of said master latch, and
   fourth means responsive to said set signal for simultaneously applying a logic "1" voltage potential to said output node.

8. Output circuitry for a programmable logic device having a combinatorial output and a reset, said circuit comprising:
   a register including a master latch, a slave latch, and a first transmission gate serially connecting said master latch and said slave latch,
   an output node,
   a second transmission gate connecting said slave latch and said output node,
   a third transmission gate connecting said combinatorial output to said master latch,
   a fourth transmission gate connecting said combinatorial output to said output node,
   first means responsive to a reset signal for applying a logic "0" voltage potential to an input to said master latch, and
   second means responsive to said reset signal for simultaneously applying a logic "0" voltage potential directly to said output node for asynchronously resetting said combinatorial output, thereby providing look-ahead resetting of said output node while said master and slave latches are resetting.

9. Circuitry as defined by claim 8 wherein said first means includes a field effect transistor connected between a logic "0" voltage potential and said master latch and having a gate for receiving said reset signal, said second means including a field effect transistor connected between a logic "0" voltage potential and said output node and having a gate for receiving said reset signal.

10. Circuitry as defined by claim 8 and further including set circuitry for asynchronously setting said macrocell and said output node comprising third means responsive to a set signal for applying a logic "0" to an output of said master latch, and fourth means responsive to said set signal for simultaneously applying a logic "1" voltage potential directly to said output node, thereby providing look-ahead setting of said output node while said master and slave latches are setting.

* * * * *